(12) United States Patent
Oohashi et al.

(10) Patent No.: US 7,815,740 B2
(45) Date of Patent: Oct. 19, 2010

(54) SUBSTRATE MOUNTING TABLE, SUBSTRATE PROCESSING APPARATUS AND SUBSTRATE PROCESSING METHOD

(75) Inventors: Kaoru Oohashi, Nirasaki (JP); Toshihiro Hayami, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 936 days.

(21) Appl. No.: 11/376,161

(22) Filed: Mar. 16, 2006

(65) Prior Publication Data

US 2006/0207725 A1 Sep. 21, 2006

Related U.S. Application Data

(60) Provisional application No. 60/666,702, filed on Mar. 31, 2005.

(30) Foreign Application Priority Data

Mar. 18, 2005 (JP) .............................. 2005-079515

(51) Int. Cl.
 *H01L 21/00* (2006.01)
 *C23C 14/00* (2006.01)
 *C23C 16/00* (2006.01)
(52) U.S. Cl. ....................... 118/724; 118/725; 118/728; 156/345.51; 156/345.52; 156/345.53

(58) Field of Classification Search ................. 118/724, 118/725, 728; 156/345.51, 345.52, 345.53
See application file for complete search history.

(56) References Cited

U.S. PATENT DOCUMENTS

| 6,432,203 | B1 * | 8/2002 | Black et al. | 118/504 |
| 6,677,167 | B2 * | 1/2004 | Kanno et al. | 438/14 |
| 2004/0115947 | A1 * | 6/2004 | Fink et al. | 438/716 |
| 2004/0187787 | A1 * | 9/2004 | Dawson et al. | 118/728 |
| 2006/0027169 | A1 * | 2/2006 | Tsukamoto et al. | 118/724 |

* cited by examiner

*Primary Examiner*—Ram N. Kackar
(74) *Attorney, Agent, or Firm*—Oblon, Spivak, McClelland, Maier & Neustadt, L.L.P.

(57) ABSTRACT

A substrate mounting table includes a plurality of passageways independently provided therein, a temperature control medium flowing through the passageways, and a gap formed between at least two of the passageways. In a substrate processing method for processing a substrate mounted on the substrate mounting table in a substrate processing apparatus while controlling a temperature thereof, a process is performed on the substrate while controlling the temperature of the substrate by flowing the temperature control medium through each of the passageways. The passageways are respectively provided in a central area of the substrate mounting table and a peripheral area located outside the central area, and the central area and the peripheral area are thermally isolated from each other by evacuating the gap so as to set the gap to a vacuum state.

16 Claims, 8 Drawing Sheets

SUBSTRATE MOUNTING TABLE, SUBSTRATE PROCESSING APPARATUS AND SUBSTRATE PROCESSING METHOD

FIELD OF THE INVENTION

The present invention relates to a substrate mounting table for mounting thereon a substrate to be processed such as a semiconductor wafer while various processes are performed on the substrate, a substrate processing apparatus having the substrate mounting table, and a substrate processing method of processing the substrate by using the substrate processing apparatus.

BACKGROUND OF THE INVENTION

Recently, in manufacturing semiconductor devices, semiconductor wafers (hereinafter, referred to as "wafers") as substrates to be processed undergo an intended process one by one while being mounted on a wafer mounting table. In this case, it is important to ensure reproducibility when a plurality of wafers is processed, and to uniformly process the surface of a single wafer sheet. For example, when a plasma etching process is performed on a wafer, it is preferable that the substrate mounting table have a temperature control function for controlling the temperature distribution in the surface of the wafer to allow, e.g., a chemical reaction to be uniformly carried out, thereby uniformly processing the surface of the wafer.

As a conventional approach dealing with the temperature control function of the substrate mounting table, there has been proposed in, e.g., Japanese Patent Laid-open Publication No. 9-17770 (e.g., the abstract) a plasma processing method wherein two coolant passageways, that is, an inner and an outer coolant passageway, are provided in the substrate mounting table so that there occurs a temperature difference between the two passageways to offset a non-uniform temperature distribution on the wafer. Therefore, a uniform temperature in the surface of the wafer is achieved.

Generally, a substrate mounting table for mounting thereon a wafer uses a metal material having an excellent thermal conductivity, such as aluminum. Thus, even though two coolant passageways are provided to cause the temperature difference in the substrate mounting table as in the above-mentioned conventional method, there may occur heat transfer therein. Accordingly, temperature controllability thereof is poor, and it is difficult to provide a desired temperature difference. In other words, even if two coolant passageways are provided, the boundary between the two passageways is not definite, so that it is difficult to rapidly control temperature due to the heat transfer therebetween, thereby making it impossible to precisely control the temperature distribution of the substrate mounting table. As a result, it is problematic in that the temperature is not made sufficiently uniform in the surface of the wafer, and consequently, a process is not conducted sufficiently uniformly.

SUMMARY OF THE INVENTION

It is, therefore, an object of the present invention to carry out a precise temperature control with a substrate mounting table to uniformly process on the surface of a wafer.

In accordance with a first aspect of the present invention, there is provided a substrate mounting table for mounting thereon a substrate to be processed while controlling a temperature thereof, which includes: a plurality of passageways independently provided in the substrate mounting table, a temperature control medium flowing through the passageways; and an insulation part provided between at least two of the passageways.

In accordance with the first aspect of the invention, the insulation part is provided between the passageways through which the temperature control medium flows, thus increasing the independent temperature controls by the two passageways and shortening a temperature control time.

In the first aspect of the present invention, the insulation part may be formed in a cylindrical shape. Further, the passageways may be respectively provided on a central area of the substrate mounting table and a peripheral area located outside the central area, and the central area and the peripheral area may be thermally isolated from each other by the insulation part.

In accordance with a second aspect of the present invention, there is provided a substrate mounting table for mounting thereon a substrate to be processed while controlling a temperature thereof, which includes: a plurality of passageways independently provided in the substrate mounting table, a temperature control medium flowing through the passageways; and a gap formed between at least two of the passageways.

In accordance with the second aspect of the present invention, the gap is formed between the passageways through which the temperature control medium flows, thus increasing the independent temperature controls by the two passageways and shortening a temperature control time. Accordingly, it is possible to control the temperature in the surface of the substrate depending on substrate processing conditions.

In the second aspect of the present invention, the gap may be formed in a cylindrical shape. Further, the passageways may be respectively provided in a central area of the substrate mounting table and a peripheral area located outside the central area, and the central area and the peripheral area may be thermally isolated from each other by the gap. Furthermore, the gap may extend upwards from a lower portion of the substrate mounting table in a cylindrical shape, and an upper portion of the gap may be enlarged transversely.

Moreover, the inside of the gap may be convertible from a depressurized state to a fluid-filled state and vice versa, and an exhaust unit may be connected to the gap to exhaust the inside of the gap. In addition, a fluid supply unit may be connected to the gap to supply a fluid into the gap, a pressure control unit may be connected to the gap to control a pressure in the gap, and a temperature control unit may be provided in the gap.

In accordance with a third aspect of the present invention, there is provided a substrate processing apparatus including the substrate mounting table of the first or the second aspect of the present invention. In this case, the substrate processing apparatus may be a plasma processing apparatus for processing a substrate by using a plasma.

In accordance with a fourth aspect of the present invention, there is provided a substrate processing method for processing a substrate mounted on a substrate mounting table in a substrate processing apparatus while controlling a temperature thereof, wherein: the substrate mounting table includes a plurality of passageways independently provided therein, a temperature control medium flowing through the passageways, and an insulation part provided between at least two of the passageways; and the substrate processing method includes the step of: flowing the temperature control medium through each of the passageways so that the substrate is processed while the temperature thereof is controlled.

In the fourth aspect of the present invention, the passageways may be respectively provided in a central area of the substrate mounting table and a peripheral area located outside the central area, and the central area and the peripheral area may be thermally isolated from each other by the insulation part.

In accordance with a fifth aspect of the present invention, the insulation part is provided a substrate processing method for processing a substrate mounted on a substrate mounting table in a substrate processing apparatus while controlling a temperature thereof, wherein: the substrate mounting table includes a plurality of passageways independently provided therein, a temperature control medium flowing through the passageways, and a gap formed between at least two of the passageways; and the substrate processing method includes the step of: flowing the temperature control medium through each of the passageways so that the substrate is processed while the temperature thereof is controlled.

In the fifth aspect of the present invention, the passageways may be respectively provided in a central area of the substrate mounting table and a peripheral area located outside the central area, and the central area and the peripheral area may be thermally isolated from each other by evacuating the gap so as to set the gap to a vacuum state. Alternatively, the heat transfer between the central area and the peripheral area may be controlled by introducing a fluid into the gap or by introducing a fluid into the gap and adjusting a pressure in the gap.

In accordance with a sixth aspect of the present invention, there is provided a substrate processing method including a first stage process and a subsequent second stage process for processing a substrate mounted on a substrate mounting table in a substrate processing apparatus, wherein: the substrate mounting table includes a plurality of passageways independently provided therein, a temperature control medium flowing through the passageways, and a gap formed between at least two of the passageways; and the substrate processing method includes the steps of: flowing the temperature control medium through each of the passageways; processing the substrate while controlling the temperature thereof by changing a heat transfer performance of the gap between the first and the second stage process.

In the sixth aspect of the present invention, the heat transfer performance of the gap may be changed by converting the inside of the gap from a vacuum state to a fluid-filled state and vice versa.

In accordance with a seventh aspect of the present invention, there is provided a computer-readable storage medium storing a control program executed on a computer, wherein: the control program is executed to control a substrate processing apparatus used in the substrate processing method of any one of the fourth to the sixth aspects of the present invention.

In accordance with the present invention, the temperature controllability by a substrate mounting table can be enhanced, so that a proper temperature control can be conducted depending on the substrate processing conditions to thereby uniformly process the surface of the substrate.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
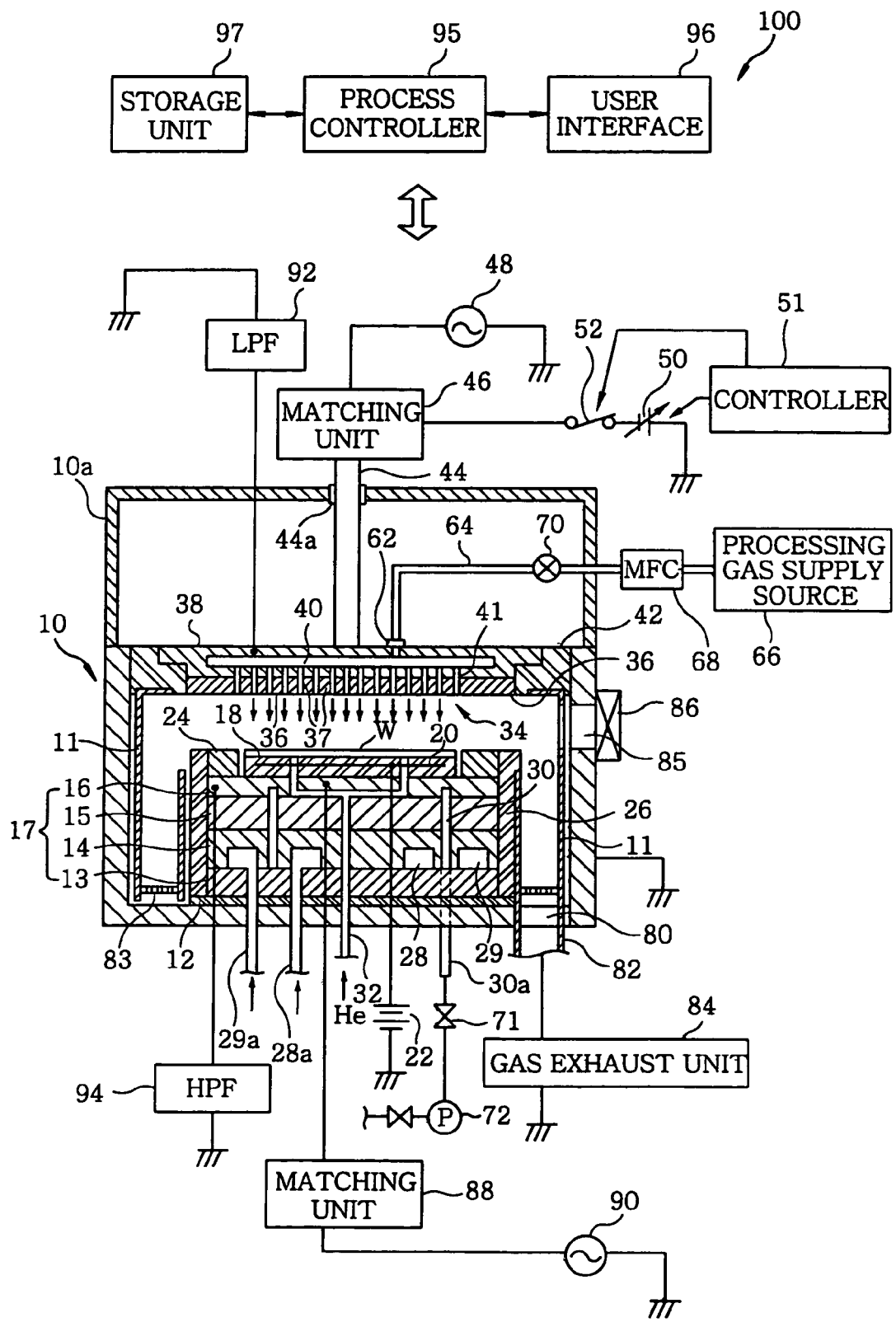
FIG. 1 illustrates a schematic sectional view of a plasma etching apparatus in accordance with a first embodiment of the present invention.

Preferred embodiments of the present invention will now be described in detail with reference to the accompanying drawings, wherein like parts appearing in the drawings are represented by like reference numerals.

FIG. 1 illustrates a schematic cross sectional view of a plasma etching apparatus 100 as a substrate processing apparatus in accordance with a first embodiment of the present invention.

The plasma etching apparatus 100 is configured as a capacitively coupled parallel plate type plasma etching apparatus, and has a cylindrical chamber (processing chamber) 10 made of aluminum, a surface of which is anodically oxidized. The chamber 10 is frame grounded.

At a lower portion in the chamber, a first susceptor plate 13, a second susceptor plate 14, and a third susceptor plate 15 are sequentially stacked from the bottom on an insulation plate 12 made of ceramic or the like, and a fourth susceptor plate 16 is layered on the third susceptor plate 15. The first to the fourth susceptor plate 13 to 16 have a circular shape and are made of, e.g., aluminum. The first to fourth susceptor plates 13, 14, 15, and 16 are integrally attached to each other to form a substrate mounting table 17. A semiconductor wafer W as a substrate to be processed is mounted on the substrate mounting table 17. Further, the substrate mounting table 17 serves as a lower electrode.

An electrostatic chuck 18 is provided on the top surface of the substrate mounting table 17, the electrostatic chuck 18 attracting and holding the semiconductor wafer W by using an electrostatic force. The electrostatic chuck 18 has a configuration that an electrode 20 formed of a conductive film is sandwiched by a pair of insulation layers or insulation sheets. A DC power source 22 is electrically connected to the electrode 20. The semiconductor wafer W is attracted to and held on the electrostatic chuck 18 due to the electrostatic force such as Coulomb force generated by a DC voltage from the DC power source 22.

In order to improve the etching uniformity, a conductive focus ring (calibration ring) 24 is provided on the upper surface of the fourth susceptor plate 16 to surround the electrostatic chuck 18 (the semiconductor wafer W). The conductive focus ring 24 is made of silicone or the like. A cylindrical inner wall member 26 made of quartz or the like is provided on the side surface of the substrate mounting table 17.

An annular inner coolant passageway 28 and an annular outer coolant passageway 29 are provided in the substrate mounting table 17. The outer coolant passageway 29 is positioned to surround the inner coolant passageway 28. A coolant, e.g., a cooling water, of a predetermined temperature is fed from an external chiller unit (not shown) through feeding lines 28a and 29a, and then discharged through discharging lines 28b and 29b (FIG. 4), so that the coolant is circulated. The temperature of the semiconductor wafer W mounted on the substrate mounting table 17 may be controlled by the temperature of the circulating coolant. A cylindrical gap 30 is provided between the inner coolant passageway 28 and the outer coolant passageway 29 of the substrate mounting table 17. The gap 30 is connected through a valve 71 to a vacuum pump 72 serving as an exhaust unit. The detailed construction of the gap 30 will be. described later.

Further, a thermally conductive gas, e.g., He gas, is supplied from a thermally conductive gas supply unit (not shown) through a gas supply line 32 to a gap between the top surface of the electrostatic chuck 18 and the bottom surface of the semiconductor wafer W.

An upper electrode 34 is provided above the substrate mounting table 17 serving as the lower electrode to face it in parallel. A space defined between the upper electrode 34 and the substrate mounting table 17 serving as the lower electrode becomes a plasma generating space. The upper electrode 34 has a surface facing the semiconductor wafer W mounted on the substrate mounting table 17, which contacts with the plasma generating space.

The upper electrode 34 is supported by an insulating shield member 42 at the upper portion of the chamber 10. The upper electrode 34 includes an electrode plate 36 and a water-cooled electrode support 38. The electrode plate 36 forms the surface facing the substrate mounting table 17, and has a plurality of injection holes 37. The electrode support 38 supports the electrode plate 36 such that the latter can be detachably attached to the former. The electrode support 38 is made of a conductive material, e.g., aluminum, and the surface thereof is anodically oxidized. Preferably, the electrode plate 36 is a low-resistance conductor or semiconductor of a low Joule heat. Meanwhile, in order to strengthen a resist, the electrode plate 36 is preferably made of a material containing silicone. Thus, the electrode plate 36 is preferably made of silicone or SiC. A gas diffusion space 40 is provided in the electrode support 38. A plurality of gas flow holes 41 extends downwards from the gas diffusion space 40 to communicate with the gas injection holes 37.

A gas introduction opening 62 is formed in the electrode support 38 to introduce a processing gas into the gas diffusion space 40. A gas supply line 64 is connected to the gas introduction opening 62, and a processing gas supply source 66 is connected to the gas supply line 64. A mass flow controller (MFC) 68 and a closable openable valve 70 are sequentially provided from the upstream side in the gas supply line 64. Further, a processing gas for etching, which is fed from the processing gas supply source 66, flows through the gas supply line 64 into the gas diffusion space 40. The processing gas passes through the gas flow holes 41 and the gas injection holes 37 to be injected into the plasma generating space in the form of a shower. That is, the upper electrode 34 serves as a shower head for supplying the processing gas.

A first high-frequency power source 48 is electrically connected to the upper electrode 34 via a matching unit 46 and a power feed rod 44. The first high-frequency power source 48 outputs a high frequency power of 13.56 MHz or higher, for example, 13.56 MHz to 60 MHZ. The matching unit 46 matches a load impedance to an internal (or output) impedance of the first high-frequency power source 48, and serves to render the output impedance of the first high-frequency power source 48 and the load impedance be seemingly matched to each other when a plasma is generated in the chamber 10. An output terminal of the matching unit 46 is connected to the top end of the power feed rod 44.

Meanwhile, a variable DC power source 50, as well as the first high-frequency power source 48, is electrically connected to the upper electrode 34. Preferably, the variable DC power source 50 is a bipolar power source. Specifically, the variable DC power source 50 is connected to the upper electrode 34 via the matching unit 46 and the power feed rod 44. The power feed of the variable DC power source 50 can be controlled by an on/off switch 52. The polarity, current and voltage of the variable DC power source 50 and the on/off operation of the on/off switch 52 are controlled by a controller 51.

Figure 2:
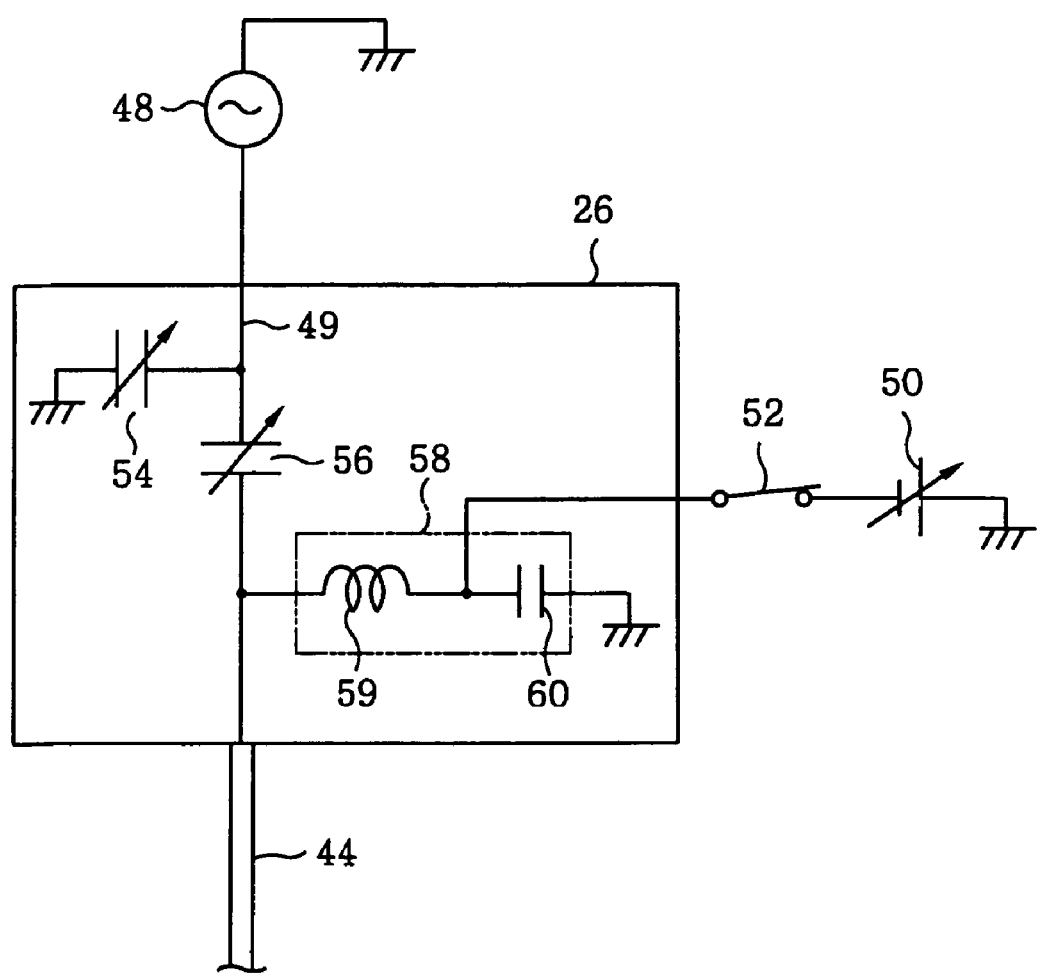
FIG. 2 illustrates the configuration of a matching unit of the plasma etching apparatus shown in FIG. 1.

As shown in FIG. 2, the matching unit 46 has a first variable capacitor 54 and a second variable capacitor 56, and functions as described above by using the first and second variable capacitors 54 and 56. The first variable capacitor 54 is branched from a power feed line 49 of the first high-frequency power source 48, and the second variable capacitor 56 is provided at a downstream side of the branching point in the power feed line 49. Further, a filter 58 is provided in the matching unit 46 to trap a high frequency (e.g. 60 MHz) from the first high-frequency power source 48 and a high frequency (e.g. 2 MHz) from a second high-frequency power source to be described later, thus allowing a DC voltage current (hereinafter, referred to as "DC voltage") to be efficiently supplied to the upper electrode 34. That is, the variable DC power source 50 is connected through the filter 58 to the power feed line 49. The filter 58 includes a coil 59 and a capacitor 60, and traps the high frequency from the first high-frequency power source 48 and the high frequency from the second high-frequency power source by using the coil 59 and the capacitor 60.

A cylindrical ground conductor 10a extends upwards from a sidewall of the chamber 10 to be located at a position higher than the upper electrode 34. The ceiling wall of the cylindrical ground conductor 10a is electrically insulated from the power feed rod 44 by a tubular insulation member 44a.

The second high-frequency power source 90 is electrically connected through a matching unit 88 to the substrate mounting table 17 serving as the lower electrode. When a high-frequency power is supplied from the second high-frequency power source 90 to the substrate mounting table 17, ions are attracted to the semiconductor wafer W. The second high-frequency power source 90 outputs a high frequency power of 2 MHz to 13.56 MHz, for example, 2 MHz. The matching unit 88 matches a load impedance to an internal (or output) impedance of the second high-frequency power source 90, and renders the internal impedance of the second high-frequency power source 90 and the load impedance be seemingly matched to each other when a plasma is generated in the chamber 10.

A low pass filter (LPF) 92 is electrically connected to the upper electrode 34 for passing the high frequency (2 MHz) from the second high-frequency power source 90 to the ground, without passing the high frequency (60 MHz) from the first high-frequency power source 48 therethrough. Although the LPF 92 preferably includes an LR filter or an LC filter, it may also include a single conducting wire capable of applying sufficient reactance to the high frequency (60 MHz) from the first radio frequency power supply 54. Meanwhile, electrically connected to the substrate mounting table 17 is a high pass filter (HPF) 94 for passing the high frequency (60 MHz) from the first high-frequency power supply 48 to the ground.

A gas exhaust port 80 is provided in the bottom of the chamber 10, and a gas exhaust unit 84 is connected to the gas exhaust port 80 through a gas exhaust line 82. The gas exhaust device 84 has a vacuum pump such as a turbo-molecular pump, and can depressurize the inside of the chamber 10 to a desired vacuum level. Further, a loading/unloading opening 85, through which the semiconductor wafer W is loaded and unloaded, is provided in the sidewall of the chamber 10. The loading/unloading opening 85 can be opened and closed by a gate valve 86. Further, a deposition shield 11 is detachably mounted to the inner wall of the chamber 10 so as to prevent an etching byproduct (deposition) from being attached to the chamber 10. That is, the deposition shield 11 serves as a chamber wall. The deposition shield 11 is also provided on the outer surface of the inner wall member 26. A gas exhaust plate 83 is provided at a lower portion of the chamber 10 between the deposition shield 11 mounted to the inner wall of the chamber 10 and the deposition shield 11 around the inner wall member 26. The deposition shield 11 and the gas exhaust plate 83 may be formed by covering an aluminum material with ceramic such as $Y_2O_3$.

Each component of the plasma etching apparatus 100 is connected to a process controller 95 having a CPU to be controlled by the process controller 95. A user interface 96 having a keyboard, a display and the like is connected to the process controller 95. A process operator uses the keyboard when inputting commands to manage the plasma etching apparatus 100. The display is used to display the operational status of the plasma etching apparatus 100.

Further, a storage unit 97 is connected to the process controller 95, the storage unit storing recipes including control programs (software) for controlling various processes executed by the plasma etching apparatus 100 by using the process controller 95 and process condition data.

If necessary, the operator selects a recipe from the storage unit 97 by using the user interface 96 to be executed by the process controller 95, so that a desired processing is performed in the plasma etching apparatus 100 under the control of the process controller 95. Further, the recipe having the control programs and the process condition data may be stored in a computer-readable storage medium such as a CD-ROM, a hard disc, a flexible disc, a flash memory and the like. Further, it is also possible to use the recipe by transmitting online it from other devices through a dedicated line, for example.

When the etching process is performed in the plasma etching apparatus 100 constructed as described above, the gate valve 86 is first opened, and the semiconductor wafer W to be etched is loaded through the loading/unloading opening 85 into the chamber 10 to be mounted on the substrate mounting table 17. Further, a processing gas for etching is supplied from the processing gas supply source 66 into the gas diffusion space 40 at a predetermined flow rate. The processing gas is supplied through the gas flow holes 41 and the gas injection holes 37 into the chamber 10 while being discharged from the chamber 10 by the gas exhaust device 84 to set the pressure in the chamber 10 to be within, e.g., a range from 0.1 to 150 Pa.

In the state where the etching gas is introduced into the chamber 10 as described above, a high frequency power (e.g., 60 MHz) for generating plasma is applied from the first high-frequency power source 48 to the upper electrode 34 at a predetermined level of power. Simultaneously, a high frequency power (e.g. 2 MHz) for attracting ions is applied from the second high-frequency power source 90 to the substrate mounting table 17 serving as the lower electrode at a predetermined level of power. Further, a predetermined DC voltage is applied from the variable DC power source 50 to the upper electrode 34. In addition, a DC voltage from the DC power source 22 for the electrostatic chuck 18 is applied to the electrode 20 of the electrostatic chuck 18, thus attracting and holding the semiconductor wafer W to the substrate mounting table 17.

The processing gas, which is injected through the gas injection holes 37 formed in the electrode plate 36 of the upper electrode 34 into the chamber 10, is plasmarized in glow discharge between the upper electrode 34 and the lower electrode, namely, the substrate mounting table 17 by the high frequency power. The surface of the semiconductor wafer W is etched by radicals and ions which are produced in the plasma.

Since the plasma etching apparatus 100 supplies a high frequency domain (above 5 MHz to 10 MHz where ions are immovable) to the upper electrode 34, it is possible to increase the density of plasma in a desirable dissociation state. Thus, a high density plasma may be produced under a lower pressure condition. When the plasma is formed as such, a DC voltage having a predetermined polarity and magnitude is applied from the variable DC power source 50 to the upper electrode 34.

The voltage applied from the variable DC power source 50 is preferably controlled by the controller 51 such that the magnitude of a self bias voltage $V_{dc}$ on the surface of the electrode plate 36 becomes greater, i.e., the absolute value of the self bias voltage $V_{dc}$ is increased to the extent that a predetermined sputter effect can be obtained for the surface of the upper electrode 34, i.e., the surface of the electrode plate 36. In case a high frequency power applied from the first high-frequency power source 48 is low, a polymer is attached to the upper electrode 34. However, by applying a proper DC voltage from the variable DC power source 50 to the upper electrode 34, the polymer attached thereto is sputtered, thereby cleaning the surface of the upper electrode 34. Further, the optimum amount of polymer can be supplied to the semiconductor wafer W, thus preventing a surface roughness of a photoresist film.

Hereinafter, the substrate mounting table 17 will be described in detail.

Figure 3:
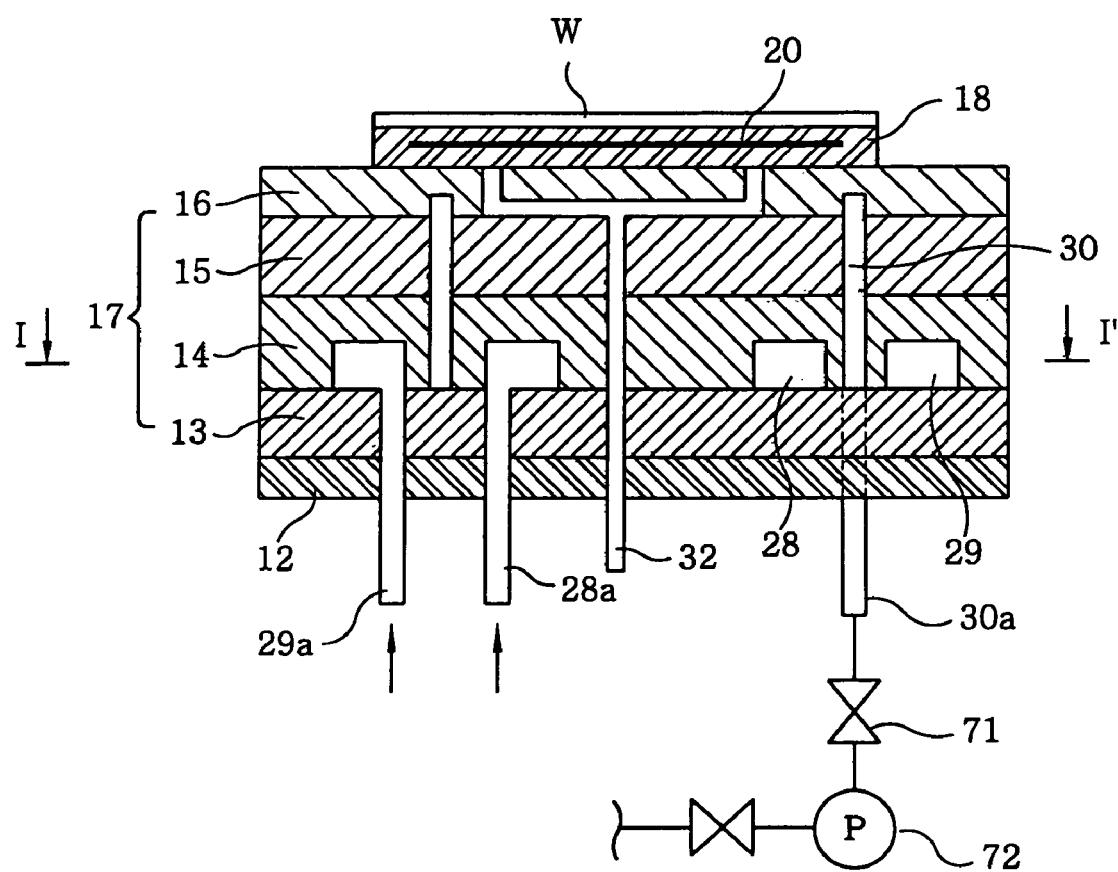
FIG. 3 presents a cross sectional view showing important parts of a substrate mounting table.
Figure 4:
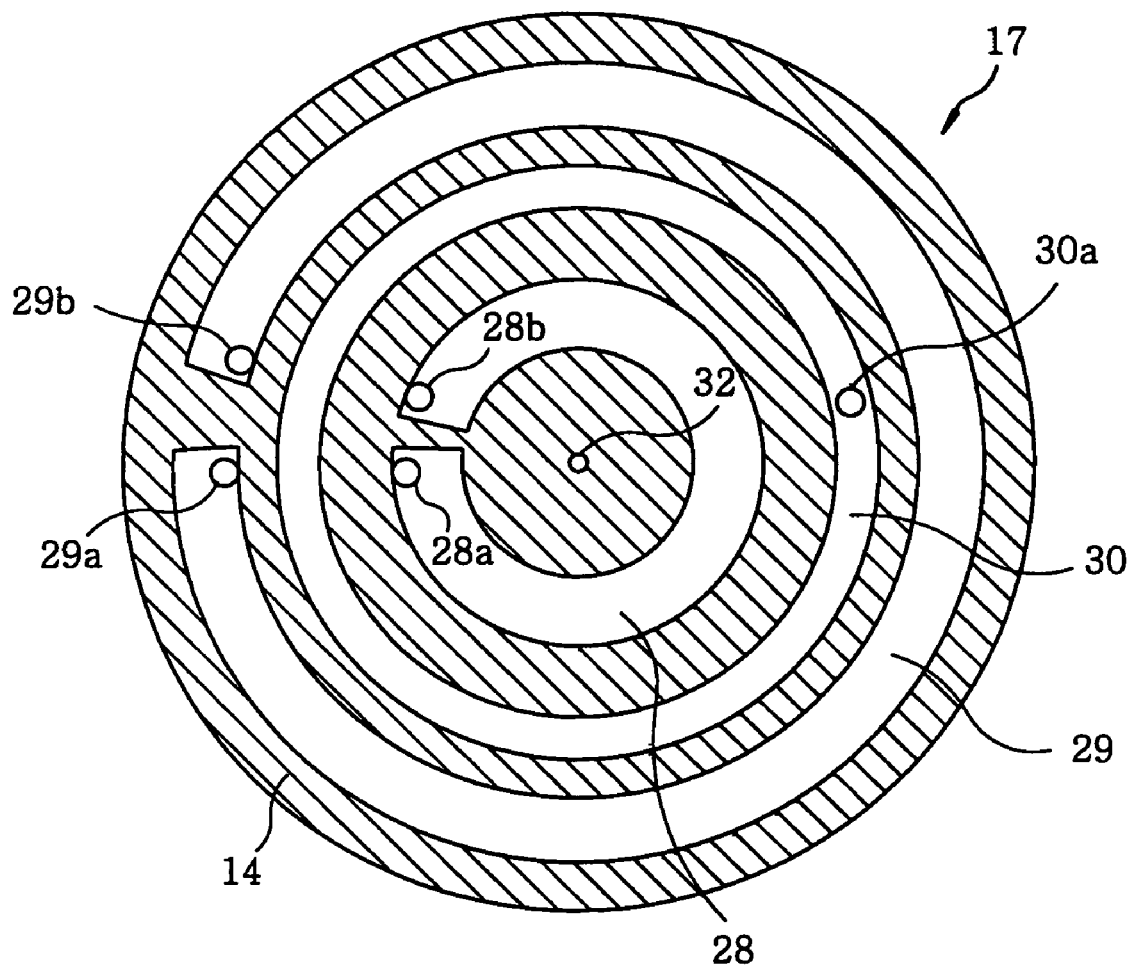
FIG. 4 depicts a cross sectional view taken along line I-I' of FIG. 3.

FIG. 3 is a sectional view showing major parts of the substrate mounting table 17 of the plasma etching apparatus 100 shown in FIG. 1, and FIG. 4 is a sectional view taken along line I-I' in FIG. 3. As described above, the annular inner coolant passageway 28 and the annular outer coolant passageway 29 are formed in the substrate mounting table 17. The coolant such as cooling water is supplied through the feeding lines 28*a* and 29*a* to the coolant passageways 28 and 29, and is discharged through the discharging lines 28*b* and 29*b*, so that the coolants in the inner and the outer coolant passageway 28 and 29 are independently circulated.

To this end, two thermally independent areas, that is, a central area and a peripheral area, are provided around the inner and the outer coolant passageway 28 and 29 in the substrate mounting table 17, respectively. Further, the gap 30 is provided between the inner and the outer coolant passageway 28 and 29 in the substrate mounting table 17, thus forming a boundary between the two areas together.

The gap 30 is a cylindrical gap defined in the substrate mounting table 17. The gap 30 may be formed in the respective susceptor plates 13, 14, 15, and 16 before the first to the fourth susceptor plate 13 to 16 are stacked to form the substrate mounting table 17.

In this embodiment, a pipe 30*a* connected to the gap 30 extends to a position below the substrate mounting table 17. Further, the vacuum pump 72 is connected through the valve 71 to the pipe 30*a*. By closing the valve 71 after the pressure in the gap 30 is decreased to a desired vacuum level by using the vacuum pump 72, the desired vacuum level can be kept in the gap 30. The vacuum state deteriorates the thermal conductivity of the gap 30, so that the gap 30 serves as an insulation part. For example, when it is desired to create a temperature difference between the central area and the peripheral area of the substrate mounting table 17, the gap 30 is evacuated to serve as the insulation part, so that the independent temperature control by the coolant passageways 28 and 29 is improved. In this way, the substrate mounting table 17 has an enhanced responsiveness to the heat transfer from the coolant flowing in each of the coolant passageways 28 and 29, and the two areas can be definitely separated from each other. As such, the gap 30 functions to make the temperature distribution in the substrate mounting table 17 by the coolant passageways 28 and 29 definite, thus enhancing a temperature controllability thereof. Thus, it is preferable to arrange the gap 30 depending on the expected temperature distribution in the surface of the wafer W.

Figure 5:
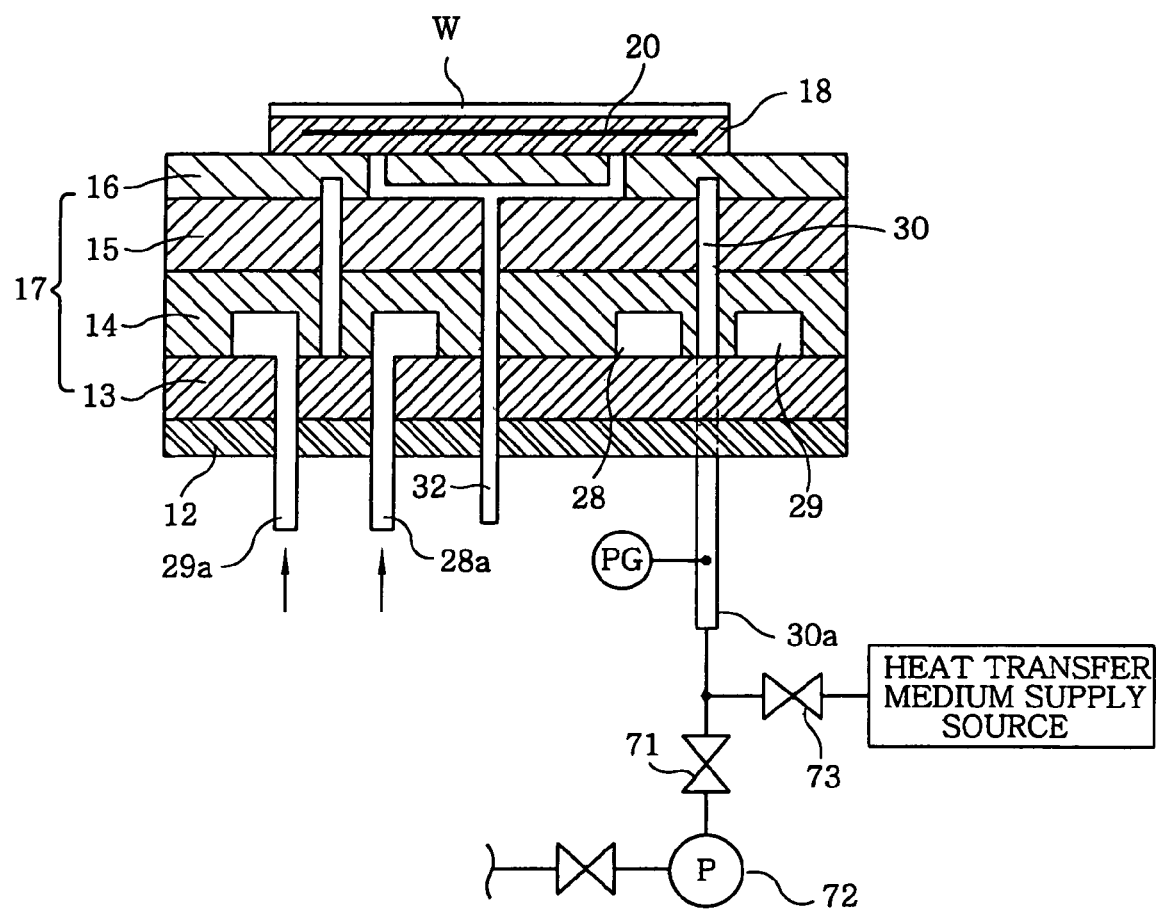
FIG. 5 offers a cross sectional view of major parts of a plasma etching apparatus in accordance with a second embodiment of the present invention.

FIG. 5 is a cross sectional view of major parts of a substrate mounting table of a plasma etching apparatus in accordance with a second embodiment of the present invention. While the vacuum pump 72 is connected to the gap 30 to evacuate the gap 30 in the first embodiment of FIG. 1, in the second embodiment, a heat transfer medium supply source 74 as well as the vacuum pump 72 is connected to the gap 30. The heat transfer medium supply source 74 is a fluid supply unit for supplying a desired gas to the gap 30. The evacuation by the vacuum pump 72 and the supply of a heat transfer medium from the heat transfer medium supply source 74 may be carried out by controlling the valve 71 and a valve 73. For example, in case it is desired to create a temperature difference between the central area and the peripheral area of the substrate mounting table 17, the gap 30 is evacuated to enhance the insulating performance thereof. Meanwhile, in case it is desired to increase the heat transfer between the central area and the peripheral area, the heat transfer medium, such as He gas, $N_2$ gas, $O_2$ gas, Ar gas and $SF_6$ gas, is introduced from the heat transfer medium supply source 74 into the gap 30. The introduction of the heat transfer medium mitigates the insulating performance of the gap 30, and facilitates the heat transfer between the central area and the peripheral area in the substrate mounting table 17.

Further, a unit for controlling the temperature of the heat transfer medium, such as a chiller unit (not shown), may be provided in a supply line from the heat transfer medium supply source 74, so that the heat transfer medium introduced into the gap 30 can be cooled to a predetermined temperature.

A pressure control unit (not shown), such as a pressure pump, may be provided in the supply line from the heat transfer medium supply source 74, so that it is possible to control the thermal conductivity of the gap 30 by increasing the pressure therein when the heat transfer medium is introduced thereinto. In this case, a pressure gauge 75 is provided at the pipe 30a of the gap 30 to monitor the pressure in the gap 30. Since the other configurations of the plasma etching apparatus of the second embodiment are same as those of the first embodiment, the descriptions thereon will be omitted. Further, the heat transfer medium is not limited to a gas, and a liquid may be used as the heat transfer medium.

In the substrate mounting table 17 of the second embodiment, by converting the state in the gap 30 from a vacuum state to a heat transfer medium-filled state and vice versa, the temperatures of the central area and the peripheral area of the substrate mounting table 17 can be controlled precisely and in a high degree of freedom depending on an intended purpose. Accordingly, in a case where the etching process for the wafer W is divided into a plurality of steps and the respective steps are conducted at different temperatures, the thermal conductivity of the gap 30 is changed in accordance with the processing conditions in each step, so that the temperature distribution of the substrate mounting table 17 can be rapidly controlled, thus carrying out the processing under optimum temperature conditions.

Figure 6:
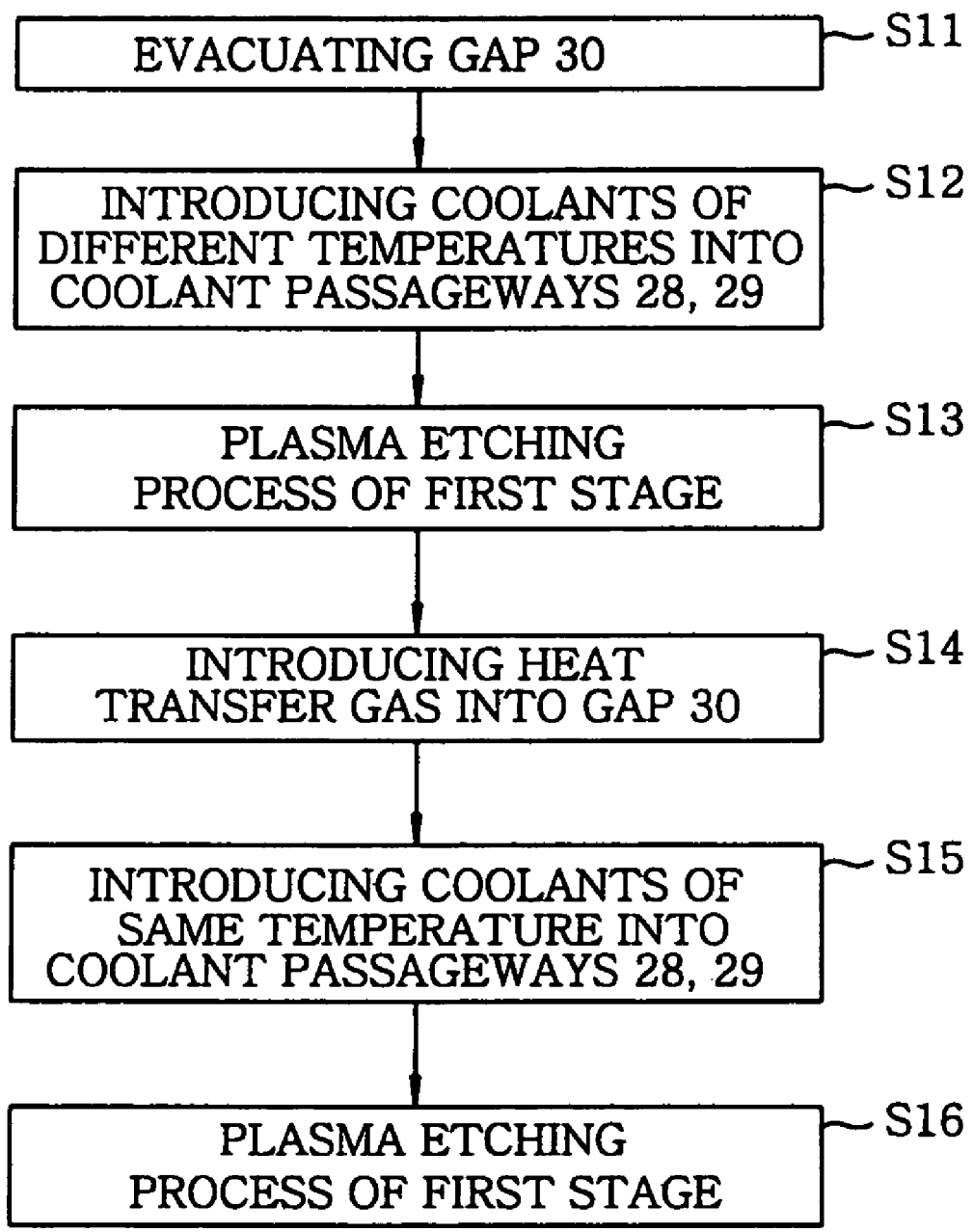
FIG. 6 illustrates a flowchart of etching processes of two stages using the plasma etching apparatus in accordance with the second embodiment of the present invention.

FIG. 6 is a flowchart of an exemplary temperature control sequence wherein etching processes are performed in two stages by using the plasma etching apparatus in accordance with the second embodiment. In this case, in the first stage, the plasma etching process is performed under the condition that there occurs a temperature difference between the central area and the peripheral area of the substrate mounting table 17 (which correspond to the central portion and the peripheral portion of the wafer W, respectively). In the second stage, the plasma etching process is performed under the condition that the central and the peripheral area of the substrate mounting table 17 have an approximately same temperature.

First, prior to the etching process, the gap 30 is evacuated at step S11. Specifically, the vacuum pump 72 is operated while the valve 73 is closed and the valve 71 is opened, to thereby depressurize the inside of the gap 30 through the pipe 30a. By closing the valve 71 when the pressure in the gap 30 reaches a predetermined vacuum level, the gap 30 is maintained at the predetermined vacuum level and functions as the insulation layer.

At step S12, coolants of different temperatures are introduced through the pipes 28a and 28b into the coolant passageways 28 and 29, respectively. For example, in a plasma etching process wherein the peripheral portion of the wafer W is apt to be heated, a coolant of a lower temperature is introduced into the outer coolant passageway 29 provided on the peripheral area of the substrate mounting table 17 while a coolant of a higher temperature is introduced into the inner coolant passageway 28. As described above, the gap 30 of the vacuum state serves as the insulation layer, so that heat transfer between the central area and the peripheral area of the substrate mounting table 17 is suppressed. Thus, respective temperature controls for the two areas can be carried out independently and in a good responsiveness.

Next, the plasma etching process of the first stage is performed at step S13. In the first stage plasma etching process, the temperature of the peripheral area of the substrate mounting table 17, corresponding to the peripheral portion of the wafer W, is controlled to be low. Accordingly, the temperature rise in the peripheral portion of the wafer W is suppressed, thus achieving uniform temperature distribution in the surface of the wafer W and allowing the surface of the wafer to be uniformly etched.

At step S14, under the condition that the valve 71 is closed, the valve 73 is set to a predetermined conductance and the heat transfer medium is introduced from the heat transfer medium supply source 74 into the gap 30. At this time, the pressure in the gap 30 is measured by the pressure gauge 75 and the valve 73 is closed when the pressure in the gap 30 reaches a preset value. It is possible to control a thermal conductivity of the gap 30 by introducing a heat transfer medium into the gap 30 and changing the pressure in the gap 30. Further, if necessary, the pressure pump (not shown) may be operated to fill the heat transfer medium in the gap 30 at a higher pressure state.

Subsequently, at step 15, the coolants of a same temperature are introduced into the respective coolant passageways 28 and 29. Since the gap 30 is filled with the heat transfer medium under the preset pressure at step S14, the heat transfer is smoothly conducted between the central area and the peripheral area of the substrate mounting table 17 via the gap 30. Further, the plasma etching process of the second stage is performed at step S16. Since the second stage plasma etching process is conducted under the condition that there hardly occurs a non-uniform temperature distribution in the surface of the wafer W, the plasma etching process can be efficiently performed by controlling the temperature of the substrate mounting table 17.

Figure 7:
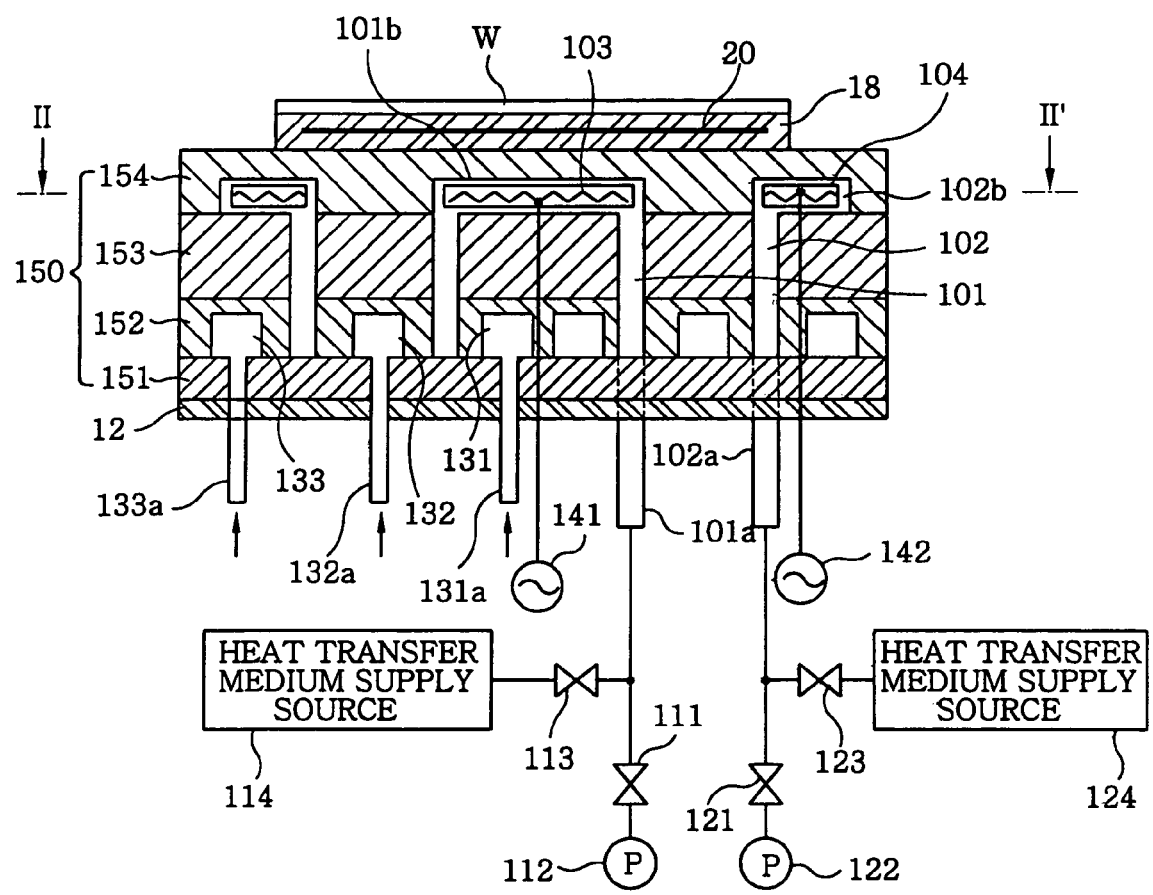
FIG. 7 illustrates a cross sectional view of major parts of a plasma etching apparatus in accordance with a third embodiment of the present invention.
Figure 8:
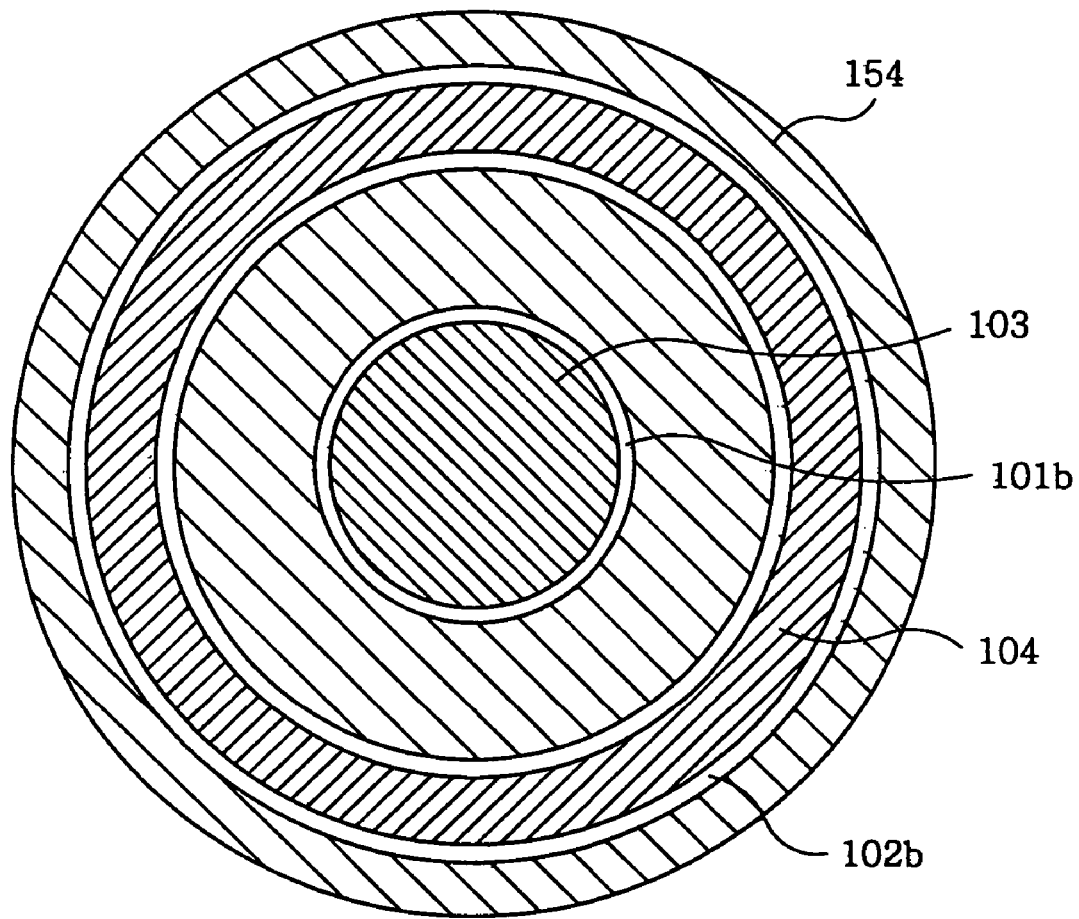
FIG. 8 depicts a cross sectional view taken along line II-II' of FIG. 7.

Hereinafter, a third embodiment of the present invention will be described with reference to FIGS. 7 and 8. FIG. 7 is a cross sectional view showing major parts of a substrate mounting table 150 of the plasma etching apparatus in accordance with the third embodiment, and FIG. 8 is a cross sectional view taken along line II-II' of FIG. 7. For the convenience of explanation, the gas supply line 32 is omitted in the drawings.

In the third embodiment, two annular gaps 101 and 102 are arranged to extend upwards from a lower portion of the substrate mounting table 150 in a cylindrical shape. The upper portions of the gaps 101 and 102 are transversely enlarged to form enlarged parts 101b and 102b, respectively.

As shown in FIG. 7, the substrate mounting table 150 has a stacked structure wherein a first susceptor plate 151, a second susceptor plate 152, a third susceptor plate 153, and a fourth susceptor plate 154 are stacked sequentially from the bottom. An annular first chamber 131, an annular second chamber 132 and an annular third coolant passageway 133 are provided in the substrate mounting table 150 in that order from the inside to the outside. The gap 101 is provided between the first and second coolant passageways 131 and 132, and the gap 102 is provided between the second and third coolant passageways 132 and 133. Further, heaters 103 and 104 serving as a temperature control unit are installed in the upper enlarged parts 101b and 102b of the gaps 101 and 102, respectively. The heaters 103 and 104 are electrically connected to heater power sources 141 and 142 to heat the insides of the gaps 101 and 102, respectively.

A vacuum pump 112 and a heat transfer medium supply source 114 are connected via a pipe 101a to the gap 101. Further, a vacuum pump 122 and a heat transfer medium supply source 124 are connected via a pipe 102a to the gap 102. The vacuum pump 112 and the heat transfer medium supply source 114 are respectively controlled by valves 111 and 113, and the vacuum pump 121 and the heat transfer medium supply source 124 are respectively controlled by valves 121 and 123. As similarly in the second embodiment (FIG. 5), a precise temperature control can be carried out by converting the insides of the gaps 101 and 102 from the vacuum state to the heat transfer medium-filled state and vice versa.

Further, in the substrate mounting table 150 in accordance with the third embodiment, if necessary, the heater power sources 141 and 142 apply powers to the respective heaters 103 and 104 to heat the inside of the gaps 101 and/or 102, thereby changing the temperature in the gaps 101, 102 within a short time. With such arrangements, in a case where the etching processes are performed in multi stages which cause temperature variations, the temperature responsiveness in the gaps 101, 102 increases, so that it is possible to efficiently control the temperature in the surface of the wafer W. Since the other parts of the third embodiment have the substantially same configurations as those of the first embodiment, explanations thereon will be omitted.

While the invention has been shown and described with respect to the preferred embodiments, it will be understood by those skilled in the art that various changes and modifications may be made without departing from the spirit and scope of the invention as defined in the following claims. For example, although the parallel plate plasma etching apparatus is described as an example in the embodiment of FIG. 1, the present invention may be applied to various kinds of plasma etching apparatus including a magnetron RIE plasma etching apparatus using permanent magnets, an inductively coupled plasma etching apparatus and the like. Moreover, the present invention may be applied to various kinds of semiconductor manufacturing apparatuses requiring a temperature control, such as a film forming apparatus, without being limited to the etching apparatus.

What is claimed is:

1. A substrate mounting table for mounting thereon a substrate to be processed while controlling a temperature thereof, which comprises:
   a plurality of passageways independently provided in the substrate mounting table, a temperature control medium flowing through the passageways;
   one or more gaps formed at least between two of the passageways; and
   one or more temperature control units provided in the gaps, wherein the gaps are in a vacuum state or a heat transfer medium-filled state,
   wherein the temperature control units are heaters electrically connected to a heater power source, respectively,
   wherein lower portions of the gaps extend upwards from a lower portion of the substrate mounting table in a cylindrical shape, and upper portions of the gaps are enlarged transversely from an upper end of the lower portion,
   wherein the heaters are installed in the transverse upper portions of the gaps respectively,
   wherein an upper transverse portion included in the inner gap of the one or more gaps is disc shaped,
   wherein an upper transverse portion included in the outer gap of the one or more gaps is annular shaped, and
   wherein each of the inner gap and the outer gap is connected to a heat transfer medium supply source and a vacuum pump at the lower end of their lower portions.

2. The substrate mounting table of claim 1, wherein the passageways are respectively provided in a central area of the substrate mounting table and a peripheral area located outside the central area, and the central area and the peripheral area are thermally isolated from each other by the gaps.

3. The substrate mounting table of claim 1, wherein the inside of the gaps are convertible from a depressurized state to a fluid-filled state and vice versa.

4. The substrate mounting table of claim 1, wherein an exhaust unit is connected to the gaps to exhaust the inside of the gaps.

5. The substrate mounting table of claim 1, wherein a fluid supply unit is connected to the gaps to supply a fluid into the gaps.

6. The substrate mounting table of claim 1, wherein a pressure control unit is connected to the gaps to control a pressure in the gaps.

7. A substrate processing apparatus comprising the substrate mounting table described in claim 1.

8. The substrate processing apparatus of claim 7, wherein the substrate processing apparatus is a plasma processing apparatus for processing a substrate by using a plasma.

9. A substrate processing apparatus comprising the substrate mounting table described in claim 1.

10. The substrate mounting table of claim 1,
    wherein the number of the passageways is equal or greater than three, and
    wherein the number of the gaps is equal or greater than two.

11. A substrate processing method for processing a substrate mounted on a substrate mounting table in a substrate processing apparatus while controlling a temperature thereof, comprising:
- providing a plurality of separated passageways in the substrate mounting table;
- forming one or more gaps at least between two of the passageways;
- providing one or more temperature control units in the gaps;
- flowing the temperature control medium through each of the passageways so that the substrate is processed while the temperature thereof is controlled; and
- controlling the temperature in the gaps by the temperature control units,
- wherein the gaps are in a vacuum state or a heat transfer medium-filled state,
- wherein the temperature control units are heaters electrically connected to a heater power source,
- wherein lower portions of the gaps extend upwards from a lower portion of the substrate mounting table in a cylindrical shape, and upper portions of the gaps are enlarged transversely from an upper end of the lower portion,
- wherein the heaters are installed in the transverse upper portions of the gaps respectively,
- wherein an upper transverse portion included in the inner gap of the one or more gaps is disc shaped,
- wherein an upper transverse portion included in the outer gap of the one or more gaps is annular shaped, and
- wherein each of the inner gap and the outer gap is connected to a heat transfer medium supply source and a vacuum pump at the lower end of their lower portions.

12. The substrate processing method of claim 11, wherein the passageways are respectively provided in a central area of the substrate mounting table and a peripheral area located outside the central area, and the central area and the peripheral area are thermally isolated from each other by evacuating the gaps so as to set the gaps to a vacuum state.

13. The substrate processing method of claim 11, wherein the passageways are respectively provided in a central area of the substrate mounting table and a peripheral area located outside the central area, and the heat transfer between the central area and the peripheral area is controlled by introducing a fluid into the gaps.

14. The substrate processing method of claim 11, wherein the passageways are respectively provided in a central area of the substrate mounting table and a peripheral area located outside the central area, and the heat transfer between the central area and the peripheral area are controlled by introducing a fluid into the gaps and adjusting a pressure in the gaps.

15. A computer-readable storage medium storing a control program executed on a computer, wherein:
- the control program is executed to control a substrate processing apparatus used in the substrate processing method described in claim 11.

16. The substrate processing method of claim 11,
- wherein the number of the passageways is equal or greater than three, and
- wherein the number of the gaps is equal or greater than two.

* * * * *